United States Patent
Chen et al.

(10) Patent No.: US 10,312,204 B2
(45) Date of Patent: Jun. 4, 2019

(54) SYSTEM AND METHOD FOR AN IMPROVED INTERCONNECT STRUCTURE

(71) Applicant: Taiwan Semiconductor Manufacturing Company, Ltd., Hsinchu (TW)

(72) Inventors: Hsien-Wei Chen, Hsinchu (TW); Hao-Yi Tsai, Hsinchu (TW); Mirng-Ji Lii, Sinpu Township (TW); Chen-Hua Yu, Hsinchu (TW); Tsung-Yuan Yu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/055,768

(22) Filed: Aug. 6, 2018

(65) Prior Publication Data

US 2018/0374807 A1 Dec. 27, 2018

Related U.S. Application Data

(62) Division of application No. 15/460,393, filed on Mar. 16, 2017, now Pat. No. 10,043,770, which is a
(Continued)

(51) Int. Cl.
*H05K 1/00* (2006.01)
*H01L 23/00* (2006.01)
(Continued)

(52) U.S. Cl.
CPC ............ *H01L 24/02* (2013.01); *H01L 21/486* (2013.01); *H01L 21/52* (2013.01); *H01L 21/565* (2013.01);
(Continued)

(58) Field of Classification Search
CPC . H05K 1/00; H05K 1/11; H05K 1/115; H05K 3/00; H05K 3/10; H01L 21/60; H01L 23/48; H01L 23/498
(Continued)

(56) References Cited

U.S. PATENT DOCUMENTS 4,739,448 A 4/1988 Rowe et al.
5,818,699 A 10/1998 Fukuoka
(Continued)

FOREIGN PATENT DOCUMENTS

JP 2006120978 5/2006
KR 20010056082 7/2001
(Continued)

*Primary Examiner* — Xiaoliang Chen
(74) *Attorney, Agent, or Firm* — Slater Matsil, LLP

(57) ABSTRACT

Presented herein are an interconnect structure and method for forming the same. The interconnect structure includes a contact pad disposed over a substrate and a connector disposed over the substrate and spaced apart from the contact pad. A passivation layer is disposed over the contact pad and over connector, the passivation layer having a contact pad opening, a connector opening, and a mounting pad opening. A post passivation layer including a trace and a mounting pad is disposed over the passivation layer. The trace may be disposed in the contact pad opening and contacting the mounting pad, and further disposed in the connector opening and contacting the connector. The mounting pad may be disposed in the mounting pad opening and contacting the opening. The mounting pad may be separated from the trace by a trace gap, which may optionally be at least 10 μm.

17 Claims, 5 Drawing Sheets

Related U.S. Application Data division of application No. 14/996,016, filed on Jan. 14, 2016, now Pat. No. 9,633,870, which is a division of application No. 13/799,157, filed on Mar. 13, 2013, now Pat. No. 9,275,925.

(60) Provisional application No. 61/778,228, filed on Mar. 12, 2013.

(51) Int. Cl.

| | |
|---|---|
| H01L 23/31 | (2006.01) |
| H01L 21/56 | (2006.01) |
| H01L 23/532 | (2006.01) |
| H01L 21/48 | (2006.01) |
| H01L 21/52 | (2006.01) |
| H01L 21/768 | (2006.01) |
| H01L 23/525 | (2006.01) |

(52) U.S. Cl.
CPC ...... *H01L 21/566* (2013.01); *H01L 21/76877* (2013.01); *H01L 23/3192* (2013.01); *H01L 23/53295* (2013.01); *H01L 24/05* (2013.01); *H01L 24/13* (2013.01); *H01L 23/525* (2013.01); *H01L 23/53214* (2013.01); *H01L 23/53228* (2013.01); *H01L 23/53242* (2013.01); *H01L 23/53257* (2013.01); *H01L 24/03* (2013.01); *H01L 24/11* (2013.01); *H01L 2224/0239* (2013.01); *H01L 2224/02311* (2013.01); *H01L 2224/02371* (2013.01); *H01L 2224/02373* (2013.01); *H01L 2224/0401* (2013.01); *H01L 2224/05008* (2013.01); *H01L 2224/05124* (2013.01); *H01L 2224/05139* (2013.01); *H01L 2224/05144* (2013.01); *H01L 2224/05147* (2013.01); *H01L 2224/05548* (2013.01); *H01L 2224/05572* (2013.01); *H01L 2224/05573* (2013.01); *H01L 2224/05611* (2013.01); *H01L 2224/05616* (2013.01); *H01L 2224/05624* (2013.01); *H01L 2224/05639* (2013.01); *H01L 2224/05644* (2013.01); *H01L 2224/05647* (2013.01); *H01L 2224/10125* (2013.01); *H01L 2224/1181* (2013.01); *H01L 2224/1191* (2013.01); *H01L 2224/11849* (2013.01); *H01L 2224/13026* (2013.01); *H01L 2224/13111* (2013.01); *H01L 2224/13116* (2013.01); *H01L 2224/13124* (2013.01); *H01L 2224/13144* (2013.01); *H01L 2224/13147* (2013.01); *H01L 2224/13155* (2013.01); *H01L 2224/13164* (2013.01); *H01L 2224/16145* (2013.01); *H01L 2224/16225* (2013.01); *H01L 2224/16227* (2013.01); *H01L 2224/81815* (2013.01); *H01L 2924/014* (2013.01); *H01L 2924/0105* (2013.01); *H01L 2924/01013* (2013.01); *H01L 2924/01029* (2013.01); *H01L 2924/01047* (2013.01); *H01L 2924/01074* (2013.01); *H01L 2924/01079* (2013.01); *H01L 2924/01082* (2013.01); *H01L 2924/181* (2013.01); *H01L 2924/3512* (2013.01)

(58) Field of Classification Search
USPC ......... 438/613; 257/691, 780, 737; 174/258, 174/264, 266; 29/829, 852
See application file for complete search history.

(56) References Cited

U.S. PATENT DOCUMENTS

| | | | |
|---|---|---|---|
| 5,830,563 A | 11/1998 | Shimoto et al. | |
| 5,923,539 A | 7/1999 | Matsui et al. | |
| 5,949,654 A | 9/1999 | Fukuoka | |
| 5,969,422 A | 10/1999 | Ting et al. | |
| 6,181,278 B1 | 1/2001 | Kakimoto et al. | |
| 6,329,610 B1 | 12/2001 | Takubo et al. | |
| 6,365,843 B1 | 4/2002 | Shirai et al. | |
| 6,407,343 B1 | 6/2002 | Tanaka | |
| 6,793,505 B2 | 9/2004 | Dishongh et al. | |
| 6,828,510 B1 | 12/2004 | Asai et al. | |
| 7,449,781 B2 | 11/2008 | Nakai | |
| 9,741,647 B2* | 8/2017 | Muramatsu | H01L 23/49822 |
| 2002/0000895 A1 | 1/2002 | Takahashi et al. | |
| 2002/0158341 A1 | 10/2002 | Murayama | |
| 2003/0043556 A1 | 3/2003 | Sugimoto et al. | |
| 2003/0102151 A1 | 6/2003 | Hirose et al. | |
| 2004/0004293 A1* | 1/2004 | Murayama | H01L 23/49811 257/780 |
| 2004/0089470 A1 | 5/2004 | Shimoto et al. | |
| 2004/0180540 A1 | 9/2004 | Yamasaki et al. | |
| 2006/0087040 A1 | 4/2006 | Shibasaki | |
| 2006/0163740 A1 | 7/2006 | Ohno et al. | |
| 2007/0228110 A1 | 10/2007 | Eldridge et al. | |
| 2008/0149379 A1 | 6/2008 | Nagase et al. | |
| 2008/0151517 A1 | 6/2008 | Sakamoto et al. | |
| 2008/0151522 A1 | 6/2008 | Sakamoto et al. | |
| 2008/0202803 A1 | 8/2008 | Nagase et al. | |
| 2008/0314632 A1 | 12/2008 | Wu et al. | |
| 2009/0016671 A1 | 1/2009 | Asai et al. | |
| 2009/0051024 A1 | 2/2009 | Chia | |
| 2009/0065246 A1 | 3/2009 | Shih | |
| 2009/0184411 A1* | 7/2009 | Chung | H01L 24/03 257/691 |
| 2010/0018762 A1 | 1/2010 | Yoshimura et al. | |
| 2010/0071940 A1 | 3/2010 | Ejiri et al. | |
| 2010/0147560 A1 | 6/2010 | Kaneko | |
| 2010/0283148 A1 | 11/2010 | Tsai et al. | |
| 2010/0301473 A1 | 12/2010 | Sasaoka | |
| 2010/0319966 A1 | 12/2010 | Liu | |
| 2011/0018099 A1 | 1/2011 | Muramatsu | |
| 2011/0147951 A1 | 6/2011 | Murayama et al. | |
| 2011/0155442 A1 | 6/2011 | Yamada | |
| 2011/0215478 A1 | 9/2011 | Yamamichi | |
| 2011/0240351 A1* | 10/2011 | Wakita | H05K 3/4644 174/258 |
| 2011/0240356 A1* | 10/2011 | Wakita | H05K 3/4644 174/264 |
| 2011/0284277 A1 | 11/2011 | Kato | |
| 2012/0018874 A1 | 1/2012 | Lin et al. | |
| 2012/0038044 A1 | 2/2012 | Chang | |
| 2012/0080788 A1 | 4/2012 | Arai | |
| 2012/0247823 A1 | 10/2012 | Kasai et al. | |
| 2012/0276691 A1 | 11/2012 | Camacho et al. | |
| 2012/0306608 A1 | 12/2012 | Takenaka | |
| 2013/0026618 A1* | 1/2013 | Chen | H01L 23/3192 257/737 |
| 2013/0111746 A1 | 5/2013 | Maeda et al. | |
| 2013/0146345 A1 | 6/2013 | Kajihara et al. | |
| 2013/0153269 A1 | 6/2013 | Takahashi et al. | |
| 2013/0160290 A1 | 6/2013 | Maeda et al. | |
| 2013/0161079 A1 | 6/2013 | Maeda et al. | |
| 2013/0192884 A1 | 8/2013 | Furutani et al. | |
| 2013/0221505 A1 | 8/2013 | Furutani et al. | |
| 2013/0222003 A1 | 8/2013 | Taguchi et al. | |
| 2013/0232784 A1 | 9/2013 | Hida et al. | |
| 2013/0320522 A1* | 12/2013 | Lai | H01L 24/05 257/737 |
| 2014/0041923 A1* | 2/2014 | Hisada | H05K 1/115 174/266 |
| 2014/0048949 A1 | 2/2014 | Lin et al. | |
| 2014/0159250 A1 | 6/2014 | Nickerson | |
| 2014/0203438 A1 | 7/2014 | Chen et al. | |

FOREIGN PATENT DOCUMENTS

| | | |
|---|---|---|
| KR | 20080078742 A | 8/2008 |
| KR | 20090080752 | 7/2009 |
| TW | 201208021 | 2/2012 |
| TW | 201209978 | 3/2012 |
| WO | 0249103 A2 | 6/2002 |

(56) References Cited

FOREIGN PATENT DOCUMENTS

* cited by examiner

SYSTEM AND METHOD FOR AN IMPROVED INTERCONNECT STRUCTURE

PRIORITY CLAIM AND CROSS-REFERENCE

This application is a divisional of U.S. patent application Ser. No. 15/460,393, filed on Mar. 16, 2017 and entitled, "System and Method for an Improved Interconnect Structure," which application is a divisional of U.S. patent application Ser. No. 14/996,016, filed on Jan. 14, 2016 and entitled, "System and Method for an Improved Interconnect Structure," now U.S. Pat. No. 9,633,870, issued on Apr. 25, 2017, which application is a divisional of U.S. patent application Ser. No. 13/799,157, filed on Mar. 13, 2013 and entitled, "System and Method for an Improved Interconnect Structure," now U.S. Pat. No. 9,275,925, issued on Mar. 1, 2016, which claims the benefit of U.S. Provisional Application No. 61/778,228, filed on Mar. 12, 2013 and entitled "System and Method for Improved Interconnect Structure," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Solder ball grid arrays are also a technique sometimes used to join substrate, dies or packages, with an array of solder balls deposited on the bonding pads of a first substrate, and with a second substrate, die or package joined at its own bonding pad sites to the first pad via the solder balls. Solder balls may be formed on a pad as liquid solder, and then solidified for additional processing. The environment with the solder balls is subsequently heated to melt the solder balls and the packages compressed to cause the solder balls to contact the upper and lower pads.

In some systems, a trace may be disposed over an upper protective layer, above the passivation layer. Such traces may be referred to as post-passivation interconnects (PPIs). Such PPIs may be used to connect a trace on, for example, a substrate or in a redistribution layer (RDL), to a pad or land below the passivation layer. The mounting pads may have a solder ball as part of a ball grid array, or may have another package connector, permitting a second package to be mounted and still be in electrical communication with the lands below the passivation layer.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

The making and using of the presented embodiments are discussed in detail below. It should be appreciated, however, that the present disclosure provides many applicable concepts that can be embodied in a wide variety of specific contexts. The specific embodiments discussed are merely illustrative of specific ways to make and use the described conductive interconnect or joint (an "interconnect"), and do not limit the scope of the disclosure.

Embodiments will be described with respect to a specific context, namely making and using interconnects useful in, for example, fan-in or fan-out wafer level packaging or Wafer Level Chip Scale Package (WLCSP) assemblies. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

The embodiments of the present disclosure are described with reference to FIGS. 1 through 12, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

Figure 1:
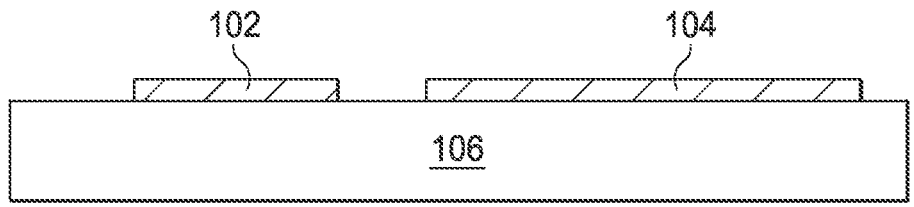
FIGS. 1 through 9 illustrate cross-sectional views of intermediate steps in forming an interconnect according to an embodiment.

FIG. 1 is a cross-sectional view representatively illustrating formation of a contact pad 102 and connector 104 of an interconnect according to an embodiment. A contact pad 102 and a connector 104 may be formed on a die substrate 106. The contact pad 102 and connector 104 may be spaced apart. In an embodiment, the contact pad 102 and connector 104 may be formed in a single process step, for example, through a masking and deposition process, through a damascene process, or another suitable process. The contact pad 102 and connector 104 may be disposed in the same level, such as on the die substrate 106, in a same metallization layer, or the like. In an embodiment, the connector 104 may be disposed in a level different from the contact pad 102, for example in a higher metallization layer, over a passivation layer above the contact pad 102, or the like.

Additionally, the contact pad 102 and connector 104 may be a conductive material, such as copper (Cu), tungsten (W), gold (Au), silver (Ag), aluminum, (Al), lead (Pb), tin (Sn), alloys of the same, and/or the like. The die substrate 106 may be a semiconductor, such as silicon (Si), gallium arsenide (GaAs), silicon-on-insulator (SoI) and/or the like. In an embodiment, the die substrate 106 may be a redistribution layer (RDL), intermetal dielectric (IMD), interlayer dielectric (ILD) and/or the like.

The contact pad 102 and connector 104 may be formed using photolithography and deposition processes such as plasma enhanced chemical vapor deposition (PECVD), physical vapor deposition (PVD), sputtering, or another deposition process. For example, the contact pad 102 and connector 104 regions may be defined by a mask, and a conductive material deposited in openings in the mask then planarized to form the contact pad 102 and connector 104. A chemical mechanical polish, for example, may be used to planarize the contact pad 102 and connector 104. While the contact pad 102 and connector 104 are illustrated as being disposed over the die substrate 106, the contact pad 102 and connector 104 may be disposed in the die substrate 106, with the upper surface of each exposed. For example, in one embodiment, the contact pad 102 and connector 104 may be formed using a damascene process. In such an embodiment, the die substrate 106 may be etched other otherwise processed to form recesses, and a conductive material may be deposited in the recesses, with excess material removed via planarization, leaving the contact pad 102 and the connector 104 in the die substrate 106 recesses.

Figure 2:
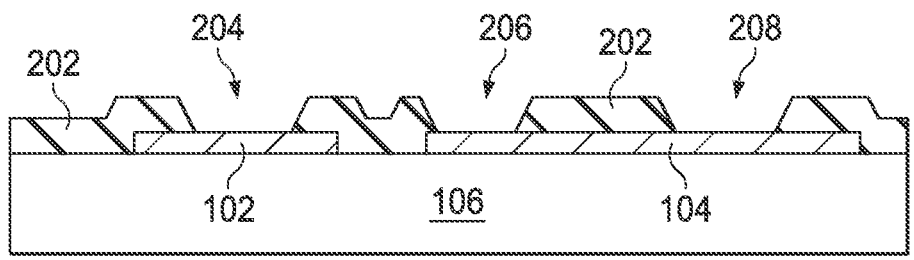

FIG. 2 is a cross-sectional view representatively illustrating formation of a passivation layer 202 according to an embodiment. An insulating layer may comprise a passivation layer 202 which may be deposited over the die substrate 106 and over a portion of the contact pad 102 and connector 104. In an embodiment, the passivation layer 202 may be masked or otherwise formed to have a contact pad opening 204 exposing a portion of the contact pad 102. A connector opening 206 and a mounting pad opening 208 may be formed in the passivation layer 202 to each expose a portion of the connector 104.

Figure 3:
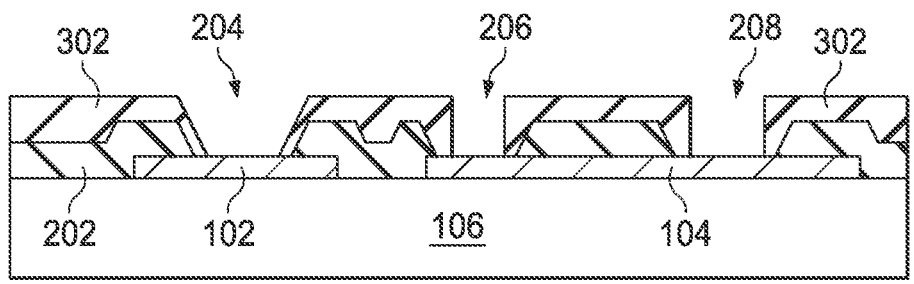

FIG. 3 is a cross-sectional view representatively illustrating formation of a protective layer 302 according to an embodiment. The insulating layer may further comprise a protective layer 302 which may be formed over the passivation layer 202, and which may be a polymer, polyimide, nitride, oxide, or other non-conductive layer. The protective layer 302 may be formed via a masking and deposition process, via a deposition and etching process, or the like. In an embodiment, the protective layer 302 may be formed to cover the passivation layer, and contacting the contact pad 102 through the contact pad opening 204 and also contacting the connector 104 through the connector opening 206 and mounting pad opening 208.

Figure 4:
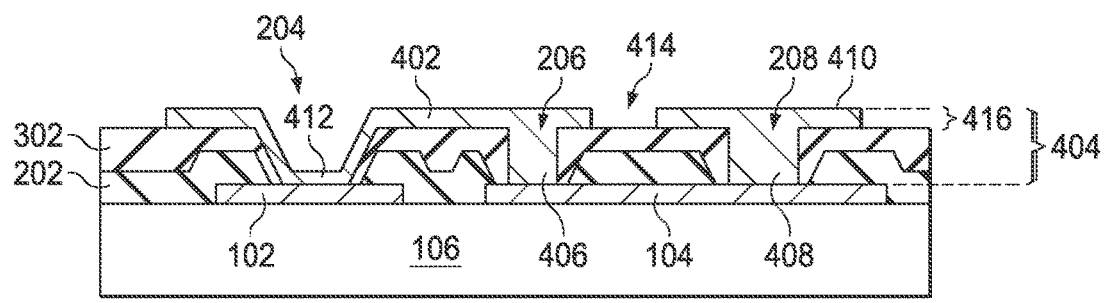

FIG. 4 is a cross-sectional view representatively illustrating formation of a post-passivation layer according to an embodiment. A post passivation layer may comprise a trace 402 and a mounting pad 404. The trace 402 and mounting pad 404 may be disposed in a layer or level higher than the contact pad 102 and connector 104, for example, over the protective layer 302, in a higher metallization layer, or the like. The trace 402 may be formed in the contact pad opening 204 with a trace contact pad portion 412 in contact with the contact pad 102. The trace 402 and mounting pad 404 may be conductive material such as a metal such as copper (Cu), tungsten (W), gold (Au), silver (Ag), aluminum, (Al), lead (Pb), tin (Sn), alloys of the same, or the like. The trace 402 may also have a trace connector via 406 disposed in the connector opening 206 and contacting the connector 104. Thus, in an embodiment, the trace 402 may electrically connect the contact pad to the connector 104. The mounting pad 404 may be formed with a mounting pad via 408 disposed in the mounting pad opening 208 and in contact with the connector 104. In an embodiment, the mounting pad 404 may have an upper mounting pad portion 416 disposed over, or above, the upper surface of the protective layer 302.

The trace 402 and mounting pad 404 are illustrated as being in direct contact with the contact pad 102 and connector 104, however, the contact pad 102 and connector 104 may have one or more outer layers, such as seed layers, barrier layers, anticorrosion layers and/or the like, and the trace 402 or mounting pad 404 may contact the contact pad 102 or connector 104 by way of these outer layers. The trace 402 and mounting pad 404 may also comprise one or more outer layers, and may contact the contact pad 102 or connector through these outer layers.

The upper mounting pad portion 416 may be separated from, or spaced apart from, the trace 402 by a trace gap 414. The trace 402 may be electrically connected to the mounting pad 404 by way of the connector 104, but may avoid direct contact with the mounting pad 404 by a separation due to the trace gap 414.

In an embodiment, the trace 402 and the mounting pad 404 may be PPI structures. The trace 402 and mounting pad 404 may be formed through deposition, plating or another technique. In an embodiment, the trace 402 and mounting pad may be formed by masking and metal deposition, or may be masked and etched after deposition.

Figure 5:
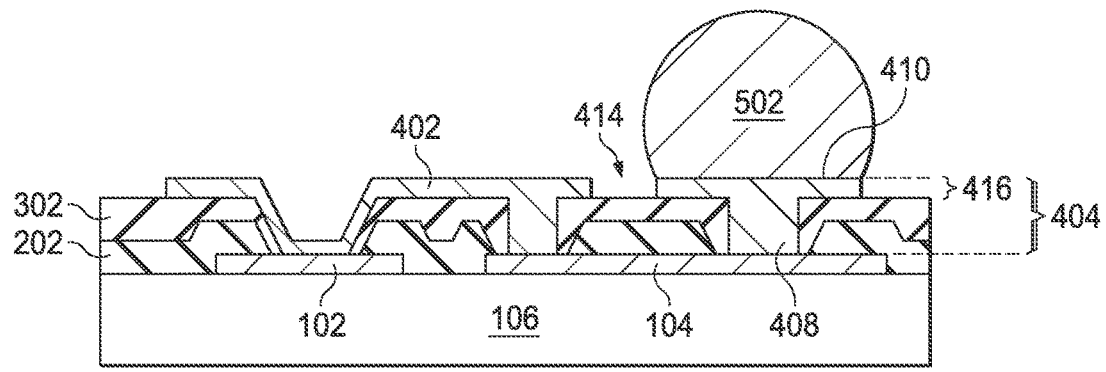

FIG. 5 is a cross-sectional view of the application of a mounting structure 502 to the mounting pad 404 according to a representative embodiment. The mounting structure 502 may be formed on a mounting pad upper surface 410. In an embodiment, the mounting structure 502 may be solder, a metal such as copper (Cu), gold (Au), aluminum, (Al), lead (Pb), tin (Sn), nickel (Ni), palladium (Pd) and/or the like. The mounting structure may also be a combination of materials such as nickel and palladium or nickel, palladium and gold that are formed for example, through a process such as electroless nickel electroless palladium (ENEP) or electroless nickel electroless palladium immersion gold (ENEPIG). In an embodiment, the trace gap 414 may be sized to avoid permitting or otherwise reduce the opportunity for material on the mounting pad 404 wetting the trace 402 and forming a weak joint. Separation of the mounting pad 404 from the trace 402 by a trace gap 414 prevents or otherwise reduces the opportunity of mounting structure 502 wetting the trace 402 and forming a "bird beak" at the trace-to-mounting pad connection point. Such irregular "bird beak" structure tends to create stress points where the mounting structure 502 contacts the trace 402, leading to stress cracking of the mounting structure 502 or separation of the mounting structure from the mounting pad 404. Eliminating or otherwise reducing irregularities in mounting structure 502 leads to a more robust joint.

In one embodiment, the mounting structure 502 may be applied to the mounting pad 404 so that the mounting structure contacts the mounting pad upper surface 410, and avoids the sides of the upper mounting pad portion 416. In such an embodiment, the mounting structure 502 may contact and cover all of, or a portion of, the mounting pad upper surface 410. In another embodiment, the mounting structure 502 may contact, or wet, at least a portion of the sides of the upper mounting pad portion 416 and at least a portion of the mounting pad upper surface 410. In yet another embodiment, the mounting structure 502 may contact the entire mounting pad upper surface 410 and contact a portion of the upper mounting pad portion 416 around the entire perimeter of the upper mounting pad portion 416, extending over the edge of the upper mounting pad portion 416 partially down the sidewall.

Figure 6:
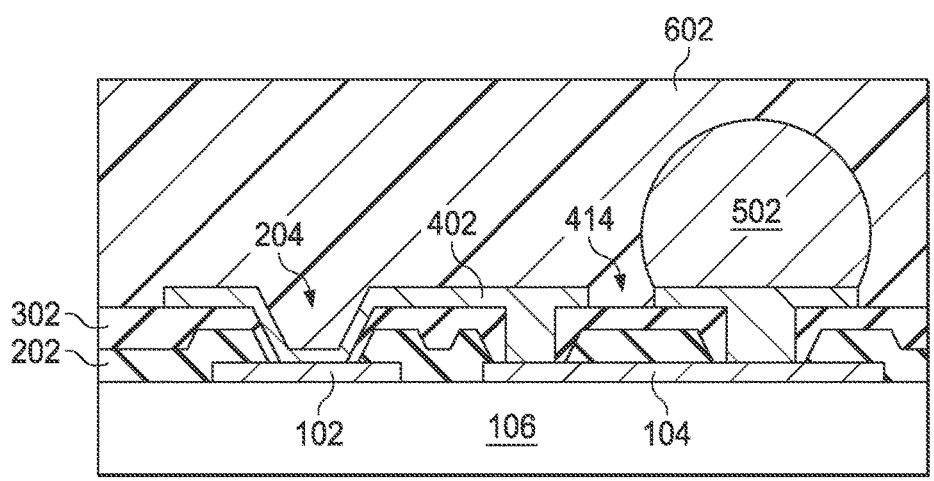

FIG. 6 is a cross-sectional view of the application of molding compound 602 according to a representative embodiment. In one embodiment, the molding compound 602 may be a nonconductive material, such as an epoxy, a resin, a moldable polymer, and/or the like. The molding compound 602 may be formed to provide lateral support to the mounting structure 502 during subsequent processing such as reflow.

Figure 7:
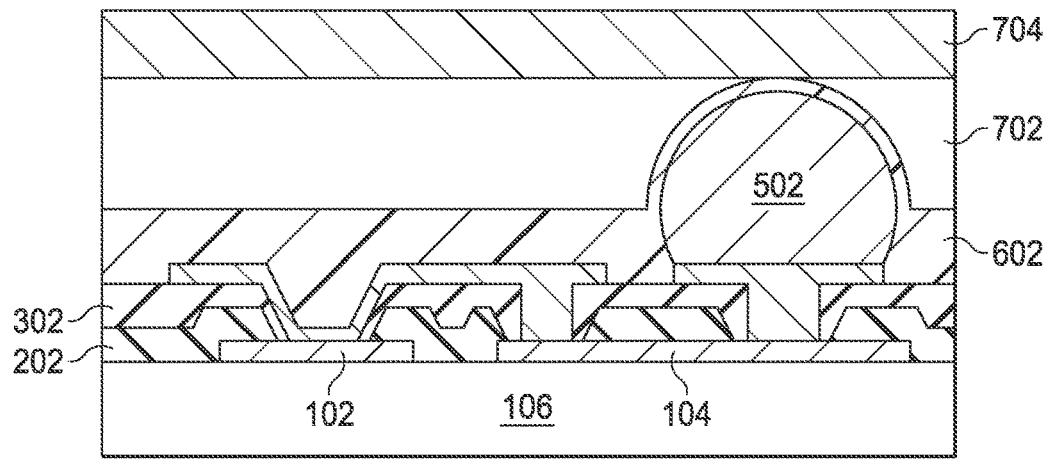

FIG. 7 is a cross-sectional view illustrating molding of the molding compound 602 according to an embodiment. The molding compound 602 may be shaped or molded using for example, a mold 704. A release compound 702 may be optionally applied to the mold 704 to prevent or otherwise reduce adhesion of the molding compound 602 to the mold 704. The mold 704 may have a border or other feature for retaining molding compound 602 when the mold 704 is applied to the molding compound 602.

The molding compound 602 may be formed by the mold 704 using a layer of release compound 702 thick enough to compress the molding compound 602 while still separating the mold 704 from the mounting structure 502. The mold 704 may also be configured to accept one or more mounting structure 502 by way of recesses (not shown) formed in the mold 704. In an embodiment, the mold 704 may be used to pressure mold the molding compound 602 to force the molding compound 602 into openings and recesses, and may avoid air pockets or the like in the molding compound 602. In an embodiment, the molding compound 602 may be injection molded, with the mold 704 placed over the mounting structure 502 and a molding compound introduced after the mold 704 is placed.

Figure 8:
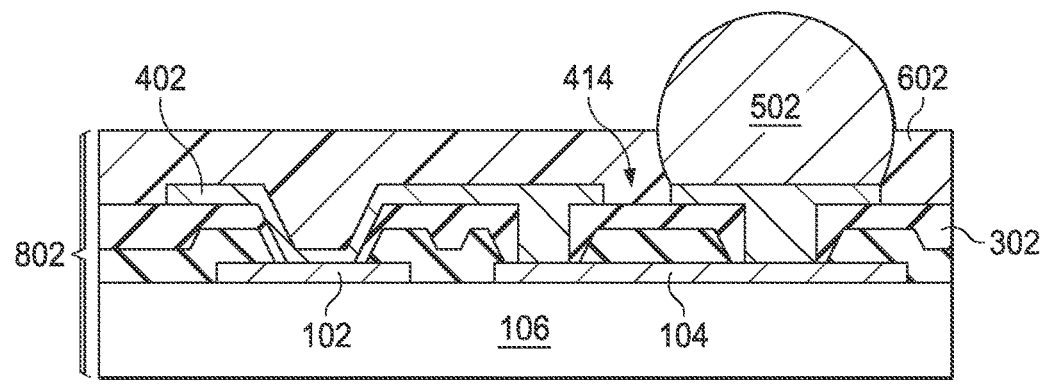

FIG. 8 is a cross-sectional view representatively illustrating a mounting structure 502 with cured molding compound 602. The molding compound 602 may be cured, and the mold 704 (FIG. 7) and release compound 702 (FIG. 7) removed. The molding compound 602 may be applied while substantially liquid, and then may be cured through a chemical reaction, such as in an epoxy or resin. In another embodiment, the molding compound 602 may be an ultraviolet (UV) cured polymer applied as a gel or malleable solid capable of being disposed on the trace 402, on the protective layer 302 and around or conforming to the mounting structure 502 surface. The optional application of the release compound 702 may permit parting of the mold 704 from the molding compound 602, and may be used in an embodiment where the molding compound 602 is an epoxy or resin to prevent or otherwise minimize adhesion of the molding compound 602 to the mold 704 surface.

In an embodiment, the molding compound 602 may be molded over a lower portion of the mounting structure 502. An upper portion of the mounting structure 502 may extend above an uppermost surface of the molding compound 602 and be exposed through the molding compound 602. The molding compound 602 retains this shape during activation or reflow. For example, where the mounting structure 502 is solder or another metal, the mounting structure 502 may be reflowed for attaching a second substrate. In such an example, the molding compound 602 may confine solder mounting structures 502 and prevent or otherwise reduce bridging between adjacent mounting structures during the reflow process.

A plasma cleaning process may optionally be performed. In an embodiment, the plasma clean process may clean the mounting structure 502 and remove any residual release compound 702 or molding compound 602.

Figure 9:
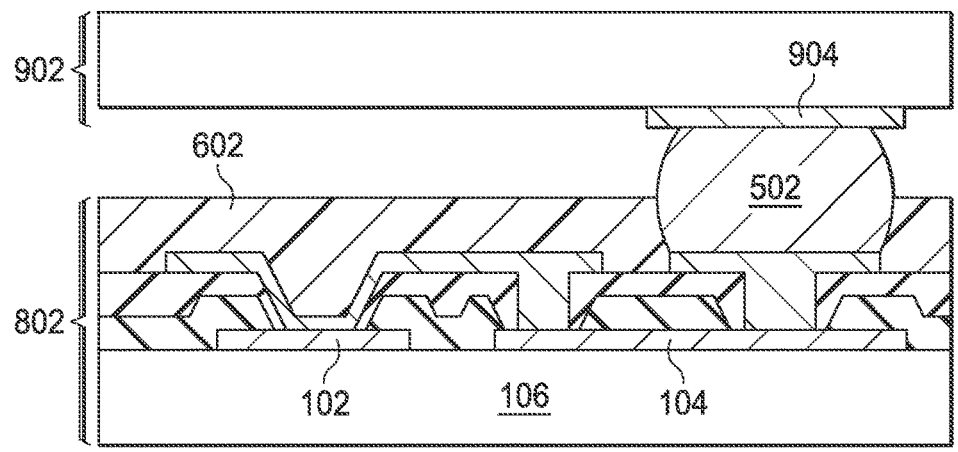

FIG. 9 is a cross-sectional view illustrating a mounting a second substrate 902 on the mounting structure 502. The mounting structure 502 material may be activated to attach the second substrate 902, thereby forming an electrical connection between the contact pad 102 on the first substrate 802 and the second substrate 902. For example, in an embodiment, the mounting structure 502 may be solder or another metal. The mounting structure 502 may be reflowed, or heated to a melting point, and the second substrate 902 may be mounted on the mounting structure 502, and the mounting structure 502 subsequently solidified In an embodiment, the second substrate 902 may have lands 904, which may be joined to the mounting structure 502. The second substrate 902 may be a die, wafer, interposer, or another electrical component. Thus, the second substrate 902 or devices disposed thereon may be electrically connected to the contact pad 102.

Figure 10:
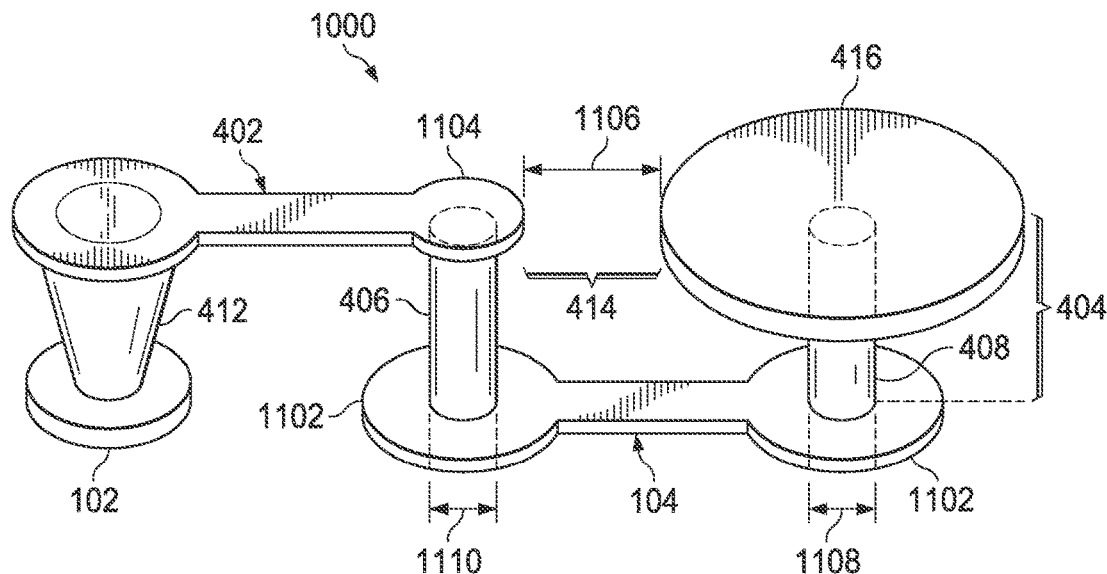
FIG. 10 illustrates a perspective view of an interconnect structure according to an embodiment.
Figure 11:
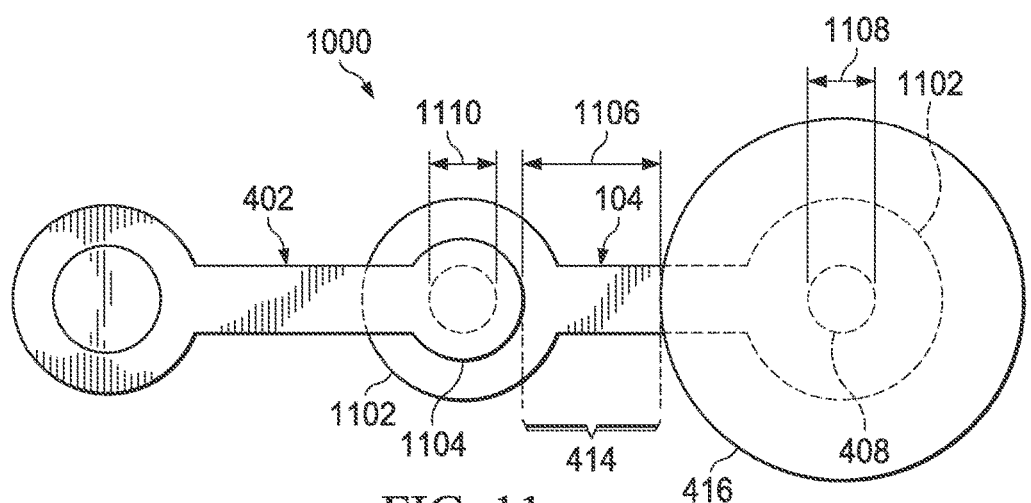
FIG. 11 illustrates a top view of an interconnect structure according to an embodiment.

FIGS. 10 and 11 illustrate a perspective view and a top view, respectively, of an interconnect structure 1000 according to a representative embodiment. The interconnect structure 1000 illustrated in FIGS. 10 and 11 is shown, for clarity, without the substrate 106, passivation layer 202, protective layer 302 or mounting structure 502 shown in FIGS. 1-9.

The mounting pad 404 has an upper mounting pad portion 416 that is disconnected or spaced apart from the trace 402 by a trace gap 414 in the region where a mounting structure 502 (FIGS. 5-9) is applied to the upper mounting pad portion 416. The upper mounting pad portion 416 is connected to the trace 402 by way of the connector 104 disposed in a different level than the upper mounting pad portion 416. The trace connector via 406 and mounting pad via 408 connect the trace 402 and upper mounting pad portion 416 to the connector 104, respectively. The connector 104 may comprise connector contact pad portions 1102 that accept the trace connector via 406 and mounting pad via 408. The connector contact pad portions 1102 may be formed having a size greater than the trace connector via diameter 1110 and mounting pad via diameter 1108. Additionally, the trace 402 may comprise a trace contact portion 1104, which may be formed having a size greater than the trace connector via diameter 1110.

The upper mounting pad portion 416 may be sized, for example, according to the material characteristics or a predetermined size of the mounting structure 502. In an embodiment, the upper mounting pad portion 416 may have a size or diameter greater than the mounting pad via 408. In an embodiment, the trace gap spacing 1106 may be about 10 µm or greater, which may be sufficient to prevent or otherwise minimize bridging of a mounting structure 502 (FIGS. 5-9) to the trace. The trace gap spacing 1106 may be adjusted to account for different geometries or disposition of the trace 102 in relation to the upper mounting pad region 416, to account for varying mounting structure 502 (FIGS. 5-9) shape and materials, to account for varying processing methods, or to account for another factor. Additionally, the trace connector via diameter 1110 and mounting pad via diameter 1108 may each be about 20 µm or greater. The via diameters 1110 and 1108 may each be independently varied to accommodate varying lengths or materials of the vias 406 and 408.

Figure 12:
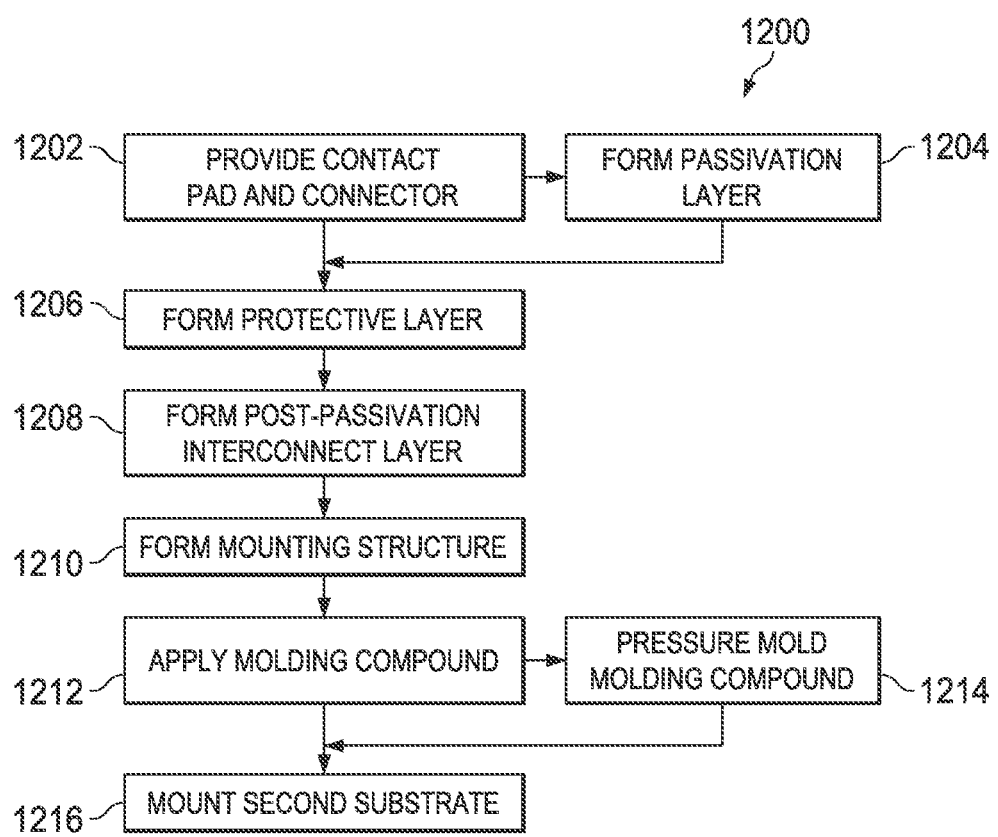
FIG. 12 is a flow diagram illustrating a method for forming an interconnect structure according to an embodiment.

FIG. 12 is a flow diagram representatively illustrating a method 1200 for forming an interconnect structure according to an embodiment. In block 1202, a contact pad and connector may be provided by forming the contact pad and connector on a die substrate, for example, or in a metallization layer. In block 1204, a passivation layer may optionally be formed over at least a portion of the contact pad and a portion of the connector. Openings exposing the contact pad and connector may be formed during passivation layer formation, or may be created after the passivation layer is formed. In block 1206, a protective layer may be formed over the contact pad and connector, with openings exposing the contact pad and connector. In block 1208, a post passivation interconnect layer may be formed over the protective layer. A trace and a mounting pad may be formed as part of the post-passivation interconnect layer, with the trace connecting the mounting pad to the connector and the mounting pad connected to the connector but spaced apart from the trace.

In block 1210, a mounting structure may be formed. In block 1212, a molding compound may be applied and in block 1214, the molding compound may optionally be pressure molded. The molding compound may be applied in block 1212 as a liquid, and a mold with an optional release compound may be used to form or pressure mold the molding compound around the mounting structure. The molding compound may also be formed over and covering the post-passivation layer, including the trace. In block 1216, a second substrate may be mounted to the mounting structure and affixed.

In an embodiment, a method includes: forming a contact pad over a substrate; forming a connector over the substrate; forming an insulating layer over the contact pad and the connector; forming a protective layer over the insulating layer; forming a trace over the connector and the contact pad, the trace extending from the contact pad, over the protective layer and the insulating layer, and to the connector; forming a mounting pad over the connector, the mounting pad being electrically coupled to the connector, the mounting pad being spaced apart from the trace by a distance, the connector being electrically interposed between the mounting pad and the trace; and forming a mounting structure on the mounting pad.

In some embodiments of the method, the forming the protective layer includes: patterning a contact pad opening and a connector opening in the insulating layer, the contact pad being exposed by the contact pad opening, the connector being exposed by the connector opening, where the protective layer is formed partially in the contact pad opening and the connector opening. In some embodiments of the method, the forming the trace includes: forming a metal layer extending over an upper surface of the insulating layer, the metal layer extending through the insulating layer and the protective layer to couple the contact pad and the connector. In some embodiments of the method, the connector and the contact pad are formed at a same level. In some embodiments of the method, the forming the mounting pad includes: depositing a metal layer, the metal layer extending over an upper surface of the insulating layer, the metal layer extending through the insulating layer to the connector. In some embodiments, the method further includes: disposing a molding compound over the trace and around the mounting structure.

In an embodiment, a method includes: forming a trace at a first level over a substrate, the trace having a major axis extending in a direction substantially parallel to a major surface of the substrate, the trace being spaced apart from a mounting pad in a direction substantially parallel to the major surface of the substrate, the trace being electrically connected to a connector and electrically connected to the mounting pad by way of the connector, the connector being disposed at a second level below the first level; forming a mounting structure on the mounting pad; and disposing a molding compound over the trace and around the mounting structure.

In some embodiments, the method further includes: forming a contact pad at the second level. In some embodiments, the method further includes: forming an insulating layer over the contact pad and the connector; and patterning the insulating layer to expose the connector, the trace extending through the patterned insulating layer. In some embodiments of the method, the forming the trace includes: patterning the insulating layer to expose the contact pad. In some embodiments of the method, the forming the trace includes: depositing a metal line, the metal line extending continuously from the contact pad to the connector, the metal line extending over an upper surface of the insulating layer. In some embodiments of the method, the molding compound contacts the upper surface of the insulating layer. In some embodiments of the method, the trace and the mounting pad are simultaneously formed.

In an embodiment, a method includes: providing a contact pad and a connector over a substrate, the substrate having a major surface; forming an insulating layer over the contact pad and the connector, the insulating layer having a first opening over the contact pad, a second opening over the connector, and a third opening over the connector; forming a trace over the insulating layer, the trace extending through the first opening to the contact pad and through the second opening to the connector, a first portion of the trace extending along a top surface of the insulating layer in a direction parallel to the major surface of the substrate; forming a mounting pad on the connector, the mounting pad extending through the third opening, the connector being electrically interposed between the trace and the mounting pad; forming a mounting structure on the connector; and disposing a molding compound over the trace and around the mounting structure.

In some embodiments of the method, the mounting pad extends over an upper surface of the insulating layer. In some embodiments of the method, the mounting structure includes a solder material. In some embodiments of the method, the forming the trace and forming the mounting pad are performed simultaneously. In some embodiments of the method, the mounting structure extends along a sidewall of the mounting pad. In some embodiments of the method, the molding compound contacts the top surface of the insulating layer. In some embodiments of the method, the molding compound is interposed between the mounting pad and the trace.

Although embodiments of the present disclosure and certain advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, articles of manufacture, composition of matter, means, methods, or steps described in the specification. As one of ordinary skill in the art will readily appreciate from the disclosure of the present disclosure, processes, machines, articles of manufacture, compositions of matter, means, methods, or steps, presently existing or later developed, that perform substantially the same function or achieve substantially the same result as the corresponding embodiments described herein may be utilized according to the present disclosure. Accordingly, the appended claims are intended to include within their scope such processes, machines, articles of manufacture, compositions of matter, means, methods, or steps.

What is claimed is:

1. A method comprising:
   providing a contact pad and a connector over a substrate, the substrate having a major surface;
   forming an insulating layer over the contact pad and the connector, the insulating layer having a first opening over the contact pad, a second opening over the connector, and a third opening over the connector;
   forming a trace over the insulating layer, the trace extending through the first opening to the contact pad and through the second opening to the connector, a first portion of the trace extending along a top surface of the insulating layer in a direction parallel to the major surface of the substrate;
   forming a mounting pad on the connector, the mounting pad extending through the third opening, the connector being electrically interposed between the trace and the mounting pad;
   forming a mounting structure on the connector; and
   disposing a molding compound over the trace and around the mounting structure.

2. The method of claim 1, wherein the mounting pad extends over an upper surface of the insulating layer.

3. The method of claim 1, wherein the mounting structure comprises a solder material.

4. The method of claim 1, wherein the forming the trace and forming the mounting pad are performed simultaneously.

5. The method of claim 1, wherein the mounting structure extends along a sidewall of the mounting pad.

6. The method of claim 1, wherein the molding compound contacts the top surface of the insulating layer.

7. The method of claim 1, wherein the molding compound is interposed between the mounting pad and the trace.

8. A method comprising:
   providing a contact pad and a connector over a substrate, the substrate having a major surface;
   forming an insulating layer over the contact pad and the connector, the insulating layer having a first opening over the contact pad, a second opening over the connector, and a third opening over the connector;
   forming a trace over the insulating layer, the trace extending through the first opening to the contact pad and through the second opening to the connector, a first portion of the trace extending along a top surface of the insulating layer in a direction parallel to the major surface of the substrate;
   forming a mounting pad on the connector, the mounting pad extending through the third opening, the connector being electrically interposed between the trace and the mounting pad;
   forming a mounting structure on the connector; and
   disposing a molding compound over the trace and around the mounting structure,
   wherein the forming the trace and forming the mounting pad are performed simultaneously, and
   wherein the molding compound is interposed between the mounting pad and the trace.

9. The method of claim 8, wherein the mounting pad extends over an upper surface of the insulating layer.

10. The method of claim 8, wherein the mounting structure comprises a solder material.

11. The method of claim 8, wherein the mounting structure extends along a sidewall of the mounting pad.

12. The method of claim 8, wherein the molding compound contacts the top surface of the insulating layer.

13. A method comprising:
    providing a contact pad and a connector over a substrate, the substrate having a major surface;
    forming an insulating layer over the contact pad and the connector, the insulating layer having a first opening over the contact pad, a second opening over the connector, and a third opening over the connector;
    forming a trace over the insulating layer, the trace extending through the first opening to the contact pad and through the second opening to the connector, a first portion of the trace extending along a top surface of the insulating layer in a direction parallel to the major surface of the substrate;
    forming a mounting pad on the connector, the mounting pad extending through the third opening, the connector being electrically interposed between the trace and the mounting pad;
    forming a mounting structure on the connector; and
    disposing a molding compound over the trace and around the mounting structure,
    wherein the forming the trace and forming the mounting pad are performed simultaneously, and
    wherein the mounting pad extends over an upper surface of the insulating layer.

14. The method of claim 13, wherein the mounting structure comprises a solder material.

15. The method of claim 13, wherein the mounting structure extends along a sidewall of the mounting pad.

16. The method of claim 13, wherein the molding compound contacts the top surface of the insulating layer.

17. The method of claim 13, wherein the molding compound is interposed between the mounting pad and the trace.

* * * * *